United States Patent [19]

Schmidhalter et al.

[11] Patent Number: 5,116,674
[45] Date of Patent: May 26, 1992

[54] COMPOSITE STRUCTURE

[75] Inventors: Beat Schmidhalter, Oberkirch; Heinz Spahni, Frenkendorf, both of Switzerland

[73] Assignee: Ciba-Geigy Corporation, Ardsley, N.Y.

[21] Appl. No.: 465,720

[22] Filed: Jan. 16, 1990

[30] Foreign Application Priority Data

Jan. 27, 1989 [CH] Switzerland ............ 275/89

[51] Int. Cl.$^5$ .............. B32B 15/04; B32B 15/20
[52] U.S. Cl. ................... 428/335; 428/469; 428/472.2
[58] Field of Search ........ 430/276, 278, 273; 428/469, 335, 472.2; 427/258; 204/15, 2, 38.3

[56] References Cited

U.S. PATENT DOCUMENTS

| | | | |
|---|---|---|---|
| 3,855,112 | 12/1974 | Tomozawa et al. | 204/15 |
| 3,953,625 | 4/1976 | Quaintance et al. | 427/258 |
| 3,961,962 | 6/1976 | Sato | 204/38.3 |
| 4,242,438 | 12/1980 | Sato | 430/278 |

FOREIGN PATENT DOCUMENTS 2184746 7/1987 United Kingdom .

OTHER PUBLICATIONS

J. of Appl. Phys. vol. 42 pp. 4941–4944 (Nov. 1971), Muth et al.
Chemical Abstract, vol. 107, No. 826645j (1987).
Patent Abstract Japan, vol. 13 #9 (p-811) (3357), Jan. 11, 1989.
Dünnschichttechologie pp. 605–609, (1987).
J. Electr. Soc. Electrochemical Science & Technology 122 (1975) pp. 32–36, Kawai et al.
J. Appl. Phys. 59 (2) Jun. 15, 1986 Smith et al.

*Primary Examiner*—Thomas J. Herbert, Jr.
*Attorney, Agent, or Firm*—Kevin T. Mansfield; Edward McC. Roberts

[57] ABSTRACT

A composite structure comprising a substrate having deposited thereon an electrically conductive metal film which is coated with a layer of porous metal oxide, wherein a thin, transparent and electrically conductive film of an anodically oxidizable metal is deposited on at least one surface of said substrate, the metal film having thereon a thin transparent coating of an oxide of said metal, and wherein the oxide coating has, distributed over the surface thereof, fine pores which are closed adjacent to the metal film.

The composite material can be used as an optical information recording material or as a transparent electrode.

15 Claims, No Drawings

COMPOSITE STRUCTURE

The invention relates to a composite structure comprising a thin, transparent and electrically conductive film of an anodically oxidizable metal deposited on at least one surface of a substrate, said metal film having thereon a thin transparent coating of an oxide of said metal, and wherein the oxide coating has, distributed over the surface thereof, fine pores which are closed adjacent to the metal film.

In Dünnschichttechnologie (Thin Layer Technology), pages 605–607, VDI-Verlag, Düsseldorf (1987), H. Frey et al. describe a number of possible utilities for transparent and electrically conductive layers. The requirement of high transparency and at the same time high electrical conductivity can be met here by oxidic semiconductor layers of e.g. indium oxide and tin oxide (ITO layers). In the case of coatings of greater area, however, it has proved difficult to observe the stoichiometric composition of the mixed oxide which is required especially for achieving a high conductivity.

It is further known that films of e.g. Cu, Ag or Au are transparent and electrically conductive when their thickness is in the order of 10 nm or less. Such thin films are not easy to produce because arrays of metallic islands form (q.v. J. Appl. Phys. 59(2), p. 571 (1986)). In J. Electrochem. Soc.: Electrochemical Science and Technology, 122,1, p. 32–34 (1975), S. Kawai et al. describe the anodic oxidation of aluminium plates to form a microporous $Al_2O_3$ coating which is separated from the aluminium metal by a compact $Al_2O_3$ layer.

U.S. Pat. No. 4,242,438 discloses the complete electrolytic conversion of an aluminium film, deposited on a thin electrical conductor, into a microporous $Al_2O_3$ coating.

It has now been found that transparent and electrically conductive metal films can be produced by anodic oxidation by selective discontinuation of the oxidation.

In one of its aspects, the invention relates to a composite structure comprising a substrate having deposited thereon an electrically conductive metal film which is coated with a layer of porous metal oxide, wherein a thin, transparent and electrically conductive film of an anodically oxidizable metal is deposited on at least one surface of said substrate, the metal film having thereon a thin transparent coating of an oxide of said metal, and wherein the oxide coating has, distributed over the surface thereof, fine pores which are closed adjacent to the metal film.

Transparent denotes a transparency of at least 10%, preferably at least 30% and especially at least 60% in the visible region of the spectrum (400–700 nm), e.g. measured at a wavelength of 500 nm, or in the near infrared region, e.g. measured at a wavelength of 1200 nm on a sample with glass as substrate. The transparency is influenced essentially by the thickness of the metal film.

Electrical conductivity denotes a maximum surface impedance $R_\square$ of the metal film of preferably at most $5 \times 10^4$ ohm, more preferably at most $5 \times 10^3$ ohm and most preferably at most $5 \times 10^2$ ohm.

The substrate can be opaque or transparent. Natural and synthetic transparent materials are preferred. The substrate may be of any form, but sheets, films and plates are preferred. The substrate may be an electrical non-conductor, a semiconductor or metals.

The substrate may be e.g. a glass, a mineral (quartz, sapphire, ruby, beryl or silicates), a ceramic material, silicon or a plastics material (cellulose, polymethacrylates, polycarbonates, polyesters, polyolefins, polystyrene). The substrate preferably consists of glass or a transparent mineral or plastics material.

The metal film can be formed of a valve metal (e.g. Ti or Ta) or an alloy of aluminium with e.g. Mg or Zn. In particular, the metal film is formed from aluminium alone.

The minimum thickness of the metal film is determined essentially by the percolation threshold at which the electrical impedance increases markedly. A preferred minimum value for the film thickness is 1.0 nm. The maximum value for the film thickness depends mainly on the desired transparency. This value may preferably be at most 50 nm. The thickness is preferably 1.0 to 10 nm and, most preferably, 1.0 to 5 nm.

The thickness of the oxide coating depends essentially on the initial thickness of the metal film. The oxide coating can be e.g. 10 nm to 50 μm thick. To avoid longer electrolysis times, it is preferably not to choose too great a thickness of metal film before electrolysis. Preferred ranges of film thicknesses are e.g. 10 nm to 10 μm and especially 10 nm to 100 nm.

The diameter of the pores in the metal oxide coating depends essentially on the process conditions during electrolysis and especially on the electrolyte used. The diameter can be e.g. from 2 nm to 500 nm.

The pores are closed adjacent to the metal film. During electrolysis, a thin barrier layer, preferably a few nm thick, forms between the metal film and porous metal oxide coating and separates these two layers from each other. The thickness of the barrier layer depends essentially on the applied voltage. It can be e.g. 1 to 100 nm, preferably 5 to 50 nm.

In another of its aspects, the invention relates to a process for the production of the composite structure, which comprises oxidizing anodically a substrate coated with a film of an anodically oxidizable metal, said film having a thickness of at least 5 nm, in an electrolyte at a voltage of 0.5 to 100 V, and discontinuing oxidation before the metal film has become completely oxidized.

The substrate coated with an anodically oxidizable metal can be obtained by known processes. Thus, for example, a substrate can be coated with an appropriate thin metal foil, the surface of the substrate having first been treated with an adhesive, if necessary. It is advantageous to use substrates to which a thin metal film is applied by sputtering, chemical methods or vacuum evaporation. The thickness of the metal film is conveniently chosen such that the metal film remaining after anodic oxidation has deposited thereon a metal oxide coating having a thickness of at least 10 nm, preferably at least 100 nm. The thickness of the metal film can be e.g. 10 nm to 50 μm, preferably 50 nm to 1 μm and especially 50 nm to 0.2 μm.

Suitable electrolytes are known and are described e.g. in J. Electrochem. Soc.: Electrochemical Science and Technology, 122,1, p. 32 (1975). Examples of suitable electrolytes are dilute aqueous solutions (e.g. containing up to 20% by weight) of inorganic acids or carboxylic acids (sulfuric acid, phosphoric acid, chromic acid, formic acid, oxalic acid), alkali metal salts of inorganic acids or carboxylic acids (sodium sulfate, sodium bisulfate, sodium formate), and alkali metal hydroxides (KOH, NaOH).

The anodic oxidation can be carried out in the temperature range from 0° to 60° C. and preferably at room temperature. The voltage to be chosen depends essentially on the electrolyte used. It can be e.g. 0.5 to 100 V. The electrolysis can be carried out with an alternating current or, preferably, with a direct current. The current intensity adjusts itself according to the chosen voltage under the predetermined conditions.

The process may be carried out such that a substrate having deposited thereon an anodically oxidizable metal film is connected to an electrical conductor by first bonding e.g. a copper wire to the end face of the substrate using a conductive adhesive. The substrate is connected up as the anode. Graphite, for example, can be used as the cathode. The substrate is immersed in the electrolyte and the desired voltage is then applied. Oxidation is continued until the opaque metal film becomes visibly transparent, and electrolysis is discontinued before the metal film has become completely oxidized. This point is determined e.g. by measuring the electrical conductivity and, if necessary, the transmittance repeatedly in the course of the electrolysis and thereby determining the time taken to reach the desired degree of oxidation. Such calibration curves can be used to establish the selective discontinuation of the reaction under predetermined reaction conditions. The drop in current density during electrolysis can also be used to determine the point at which to discontinue the reaction. The reaction time depends essentially on the thickness of the anodically oxidizable metal film and on the chosen electrolysis conditions.

It has been found useful to apply, in the end region, a current barrier made of a non-conductor, e.g. a curable or photocurable plastics material, in order to suppress capillary effects and to avoid the formation of an insulating oxide coating resulting from excessively rapid oxidation.

The composite structure of the invention can be used e.g. as an electrode, especially a transparent electrode for displays, as a window coating or for solar cells.

In yet another of its aspects, the invention further relates to the use of the composite structure as a material for recording information, especially by laser marking. In this technique, markings are burnt in the metal oxide coating and metal film with a laser beam, the low thermal conductivity and thermal capacity of the thin metal film making it possible to achieve a high energy utilization factor. The local change in transmittance or reflectance thereby achieved can be utilized for reading stored information.

The magnetic and optical properties of the composite structure of the invention can be modified by known processes. Thus, for example, according to the process described in U.S. Pat. No. 4,242,438, a silver halide can be deposited in the pores of the metal oxide coating, the system so obtained being used as a photomask.

It is also possible, by means of secondary electrolysis, to deposit metal colloids (e.g. Cu, Ag, Au, Pd, Pt or Rh), organic materials, e.g. dyes, or mixtures of such substances in the pores of the metal oxide. The resulting change in reflectance and absorption properties makes it possible to produce automobile or architectural glass having anti-solar and heat insulation properties. It is also possible to deposit metals in the pores by the electroless method. Decorative effects for shaping the surfaces of structural components can also be obtained with these processes.

In the practice of this invention, information can be recorded not only by laser marking but also by causing a locally delimited change of state in the composite structure of the invention (e.g. local melting or evaporation) with a laser.

In IEEE J. of Quantum Electronics, vol. 14, 437-495 (1978), A. Bell and F. Spong report that a trilayer system comprising a reflector (transparent metal film), a transparent separating layer (transparent metal oxide layer) and a light-absorbing layer (e.g. a dye) is often particularly useful as a recording material.

In these cases, the utilization (attenuation) of the irradiated light is particularly high if the optical layer thickness is $\lambda/4$ ($\lambda$ = wavelength of the irradiated light).

The thin aluminium film of the composite structure of the invention can therefore be used as a conductive electrode for creating a trilayer system. Absorber materials, such as gold or silver, can be introduced into the porous oxide matrix by the electrochemical reduction of corresponding metal salts. Surprisingly, it has been found that very sensitive recording substrates can be produced even with layer thicknesses well below $\lambda/4$. A very accurate dimensioning of the thicknesses of the absorber metal films can even be achieved e.g. also for creating a residual reflectance required by the servo mechanism for focusing the read-write device.

The modified or unmodified composite structure of the invention can also be provided with a protective layer, preferably made of transparent plastics materials.

The following Examples illustrate the invention in more detail. The electrical conductivity and surface impedance are determined by the four-point method.

A) PREPARATORY EXAMPLES

EXAMPLE 1

A 100 nm thick film of aluminium is evaporated on to a glass plate under vacuum. A copper wire is bonded to the end face of the aluminium film by means of a conductive adhesive (Leitplatin 308, ex Demeter, Hanau), and the film is provided underneath the contact point with a strip of a current barrier consisting of a photosensitive resist (Shipley AZ 111 S). This thin film, deposited by evaporation, is then converted by electrolysis by attaching the film to the positive terminal of a voltage source in sulfuric acid solution (15% by weight). The negative electrode consists of a graphite slab suspended in the electrolyte solution. By applying a direct current, anodic oxidation is carried out at 23° C. for 1 minute with a current density of 14 mA/cm$^2$, so that the aluminium film is partially converted to aluminium oxide. The resulting layer has a transmittance of 68% at a wavelength of 500 nm. The surface impedance $R_\square$ of the residual aluminium film is 1.2 k $\Omega$. The conductivities are determined by four-point measurements, where: $R_\square = S/D$, S being the resistivity in $\Omega$m and D being the layer thickness in m.

EXAMPLE 2

The aluminium film is oxidized anodically by the method of Example 1 for 2 sec. longer. A surface impedance of 394 $\Omega$ is measured with a transmittance of 70% in the visible region up to a wavelength of about 1200 nm.

EXAMPLE 3

The process according to Example 1 is modified in the present Example by carrying out secondary electrolysis.

A 100 nm thick aluminium film is evaporated on to a glass substrate and subjected to primary anodic oxidation in the manner described in Example 1. In this case, the film is oxidized anodically for 45 sec. at a DC voltage of 8 volts.

In a subsequent step, colloidal silver is deposited in the micropores of the $Al_2O_3$ coating for 10 sec. by means of an alternating current in an aqueous solution of metal salts (1.53 g/l of $AgNO_3$, 20 g/l of $MgSO_4$, pH 1.61).

The layer so obtained is a golden yellow colour. A surface impedance $R_\square$ of 401 $\Omega$ is obtained and the transmittance is 68% at a wavelength of 500 nm and 70% at 700 nm.

EXAMPLE 4

In this case, following the method of Example 3, anodic oxidation is discontinued after 43 sec. and silver is deposited in the oxide coating in accordance with Example 3. The surface impedance $R_\square$ is 1.8 k$\Omega$ and the transmittance is 45% at a wavelength of 500 nm and 48% at 700 nm. To determine the properties of the oxide coatings prepared in this manner, a section of the sample is placed in a transparent epoxy casting resin, peeled off after curing and cut at right-angles to the sample surface (ultramicrotomy). This section is then analyzed under a transmission electron microscope. The thickness of the metal film is found to be about 8 nm. The oxide coating is 140 nm thick and the size of the micropores is about 10 nm.

B) USE EXAMPLES

EXAMPLE 5

A glass plate (substrate) is coated with a 100 nm thick aluminium film by evaporation. An electrode connection is bonded to this coated substrate, which is oxidized anodically to form an anodic oxide coating. This is done using a sulfuric acid solution (15% by weight) and partial anodic oxidation is effected by applying a direct current at a constant voltage of 8 V at 23° C. for 65 sec. The oxide coating so obtained has a thickness of about 150 nm and the size of the micropores is about 10 nm.

Marks are made in this coating with light pulses from a dye laser (633 nm) with an energy of 1–5 nJ per pulse and a pulse length of 25 ns.

The marks made are circular holes with a diameter of 1.5 $\mu$m.

EXAMPLE 6

A glass plate with a diameter of 130 mm is coated with a 100 nm thick aluminium film. In the manner described in Example 5, anodic oxidation is carried out at 10 V DC for 50 seconds. In a subsequent step, gold is deposited in the micropores from a gold electrolyte (1 g/l of $HAuCl_4$, pH 1.8) at 8 V AC for 30 seconds. The recording substrate obtained is irradiated with light from an HeNe laser (630 nm) at an intensity of 5 mW, the radiation being focused on to a burning spot of 1.0 $\mu$m diameter on the surface. The power irradiated is sufficient to produce a hole of 1.0 to 1.2 $\mu$m.

For reproduction, an unmodulated laser beam attenuated to 10 $\mu$W is guided over the marked points as recording medium and the light reflected by the medium is measured with a light detector.

The reflectance at a previously marked point differs by 50% from that at an unmarked point.

EXAMPLE 7

A 100 nm reflector film of aluminium is deposited on a glass substrate by vacuum sputtering. In accordance with Example 3, anodic oxidation is carried out at 10 V DC for 60 seconds and silver is deposited in the micropores for 30 seconds (8 V AC). In accordance with Example 6, a dot screen with good contrast is marked in this coating with an HeNe laser.

What is claimed is:

1. A composite structure comprising a substrate having deposited thereon an electrically conductive metal film which is coated with a layer of porous metal oxide, wherein a thin, transparent and electrically conductive metal film selected from an anodically oxidizable metal is deposited on at least one surface of said substrate, said metal film having thereon a thin transparent coating of an oxide of said metal, and wherein said oxide coating has, distributed over the surface thereof, fine pores which are closed adjacent to said metal film.

2. A composite structure according to claim 1, wherein the pores have a diameter of 2 nm to 500 nm.

3. A composite structure according to claim 1, wherein the pores are separated from the metal film by a thin closed barrier layer of the metal oxide.

4. A composite structure according to claim 1, wherein the metal film is formed from a valve metal.

5. A composite structure according to claim 1, wherein the substrate consists of a glass, a mineral, a ceramic, silicon or a plastics material.

6. A composite structure according to claim 5, wherein the substrate consists of glass or a transparent mineral or plastics material.

7. A composite structure according to claim 1, wherein the metal film has a thickness of 1.0 nm to 50 nm.

8. A composite structure according to claim 7, wherein the thickness of the metal film is 1.0 to 10 nm.

9. A composite structure according to claim 8, wherein the thickness of the metal film is 1.0 nm to 5 nm.

10. A composite structure according to claim 1, wherein the oxide coating has a thickness of 10 nm to 50 $\mu$m.

11. A composite structure according to claim 10, wherein the thickness of the oxide coating is 10 nm to 10 $\mu$m.

12. A composite structure according to claim 10, wherein the thickness of the oxide coating is 10 nm to 100 nm.

13. A composite structure according to claim 1, wherein the metal film is formed from aluminum or an alloy of aluminum with magnesium or zinc.

14. A composite structure according to claim 13, wherein the metal film is formed from aluminium.

15. A process for the production of a composite structure according to claim 1, which comprises oxidizing anodically a substrate coated with a film of an anodically oxidizable metal, said film having a thickness of at least 5 nm, in an electrolyte at a voltage of 0.5 to 100 V, and discontinuing oxidation before the metal film has become completely oxidized.

* * * * *